(12) United States Patent
Bobier et al.

(10) Patent No.: US 7,542,526 B2
(45) Date of Patent: Jun. 2, 2009

(54) INTEGER CYCLE EVENT DETECTION USING WAVELET PASS FILTER SYSTEM AND METHOD

(75) Inventors: Joseph A. Bobier, Sunrise, FL (US); Nadeem Khan, Sunrise, FL (US)

(73) Assignee: XG Technology, Inc., Sarasota, FL (US)

( * ) Notice: Subject to any disclaimer, the term of this patent is extended or adjusted under 35 U.S.C. 154(b) by 729 days.

(21) Appl. No.: 11/142,519

(22) Filed: Jun. 1, 2005

(65) Prior Publication Data

US 2005/0276353 A1    Dec. 15, 2005

Related U.S. Application Data

(60) Provisional application No. 60/576,927, filed on Jun. 4, 2004.

(51) Int. Cl.
*H04L 27/06*    (2006.01)
(52) U.S. Cl. .................................... 375/340
(58) Field of Classification Search ............. 375/130, 375/239, 316, 340
See application file for complete search history.

(56) References Cited

U.S. PATENT DOCUMENTS

| 2002/0024707 A1* | 2/2002 | Lee et al. .................. 359/181 |
| 2002/0034268 A1* | 3/2002 | Miyanabe et al. ........... 375/340 |
| 2006/0078038 A1* | 4/2006 | McCorkle ................... 375/130 |

* cited by examiner

*Primary Examiner*—Don N Vo
(74) *Attorney, Agent, or Firm*—Dennis L. Cook, Esq.

(57) ABSTRACT

A system and method to transport high bit-rate data over wired or wireless communication systems using specially modulated radio frequency carrier waves using an integer cycle or impulse modulation detection method where the signal to be demodulated is generally split, delayed, inverted and summed. When such integer cycle or impulse modulation modulated signals are passed through the system, the delayed signal is not the inverse of the non-delayed signal when there is data present. The resultant summed signal does not cancel completely, thus, resulting in a demodulated signal that is present only as long as the data is present in the integer or impulse modulated signal. This nulling effect also results in reducing the interference from other signals thereby improving the signal to noise ratio of the system. Thus the system not only reduces the interference from other channels, but it is a very fast demodulator that has the capability of demodulating the signal on an integer cycle basis.

20 Claims, 7 Drawing Sheets

Incoming Signal

λ Delayed Signal

Figure 4

Demodulated Signal

Figure 5

Incoming Signal

½ λ Delayed Signal

Figure 6

Demodulated Signal

INTEGER CYCLE EVENT DETECTION USING WAVELET PASS FILTER SYSTEM AND METHOD

CROSS-REFERENCE TO RELATED APPLICATION

The present application claims the benefit of previously filed co-pending Provisional Patent Application, Ser. No. 60/576,927 filed on Jun. 4, 2004.

FIELD OF THE INVENTION

This invention addresses the need to transport high bit-rate data over wired or wireless means using specially modulated radio frequency carrier waves. Specifically, the invention provides an integer cycle or impulse modulation detection method.

BACKGROUND OF THE INVENTION

Radio transmission of information traditionally involves employing electromagnetic waves or radio waves as a carrier. Where the carrier is transmitted as a sequence of fully duplicated wave cycles or wavelets, no information is considered to be transmissible. To convey information, historically, the carrier has superimposed on it a sequence of changes that can be detected at a receiving point or station. The changes imposed correspond with the information to be transmitted, and are known in the art as "modulation."

Where the amplitude of the carrier is changed in accordance with information to be conveyed, the carrier is said to be amplitude modulated (AM). Similarly, where the frequency of the carrier is changed in accordance with information to be conveyed, either rarified or compressed wave cycles are developed, and the carrier is said to be frequency modulated (FM), or in some applications, it is considered to be phase modulated. Where the carrier is altered by interruption corresponding with information, it is said to be pulse modulated.

Currently, essentially all forms of the radio transmission of information are carried out with amplitude modulation, frequency modulation, pulse modulation or combinations of one or more. All such forms of modulation have inherent inefficiencies. For instance, a one KHz audio AM modulation of a Radio Frequency (RF) carrier operating at one MHz will have a carrier utilization ratio of only 1:1000. A similar carrier utilization occurs with corresponding FM modulation. Also, for all forms of currently employed carrier modulation, frequencies higher and lower than the frequency of the RF carrier are produced. Because they are distributed over a finite portion of the spectrum on each side of the carrier frequency, they are called side frequencies and are referred to collectively as sidebands. These sidebands contain all the message information and it has been considered that without them, no message can be transmitted. Sidebands, in effect, represent a distribution of power or energy from the carrier and their necessary development has lead to the allocation of frequencies in terms of bandwidths by governmental entities in allocating user permits within the radio spectrum. This necessarily limits the number of potential users for a given RF range of the spectrum.

To solve the bandwidth crisis in the RF Spectrum, multiple access systems were developed. Multiple Access Systems are useful when more than one user tries to transmit information over the same medium. The use of multiple access systems is more pronounced in Cellular telephony; however, they are also used in data transmission and TV transmission. There are three common multiple access systems. They are:
1. Frequency Division Multiple Access (FDMA)
2. Time Division Multiple Access (TDMA)
3. Code Division Multiple Access (CDMA)

FDMA is used for standard analog cellular systems. Each user is assigned a discrete slice of the RF spectrum. FDMA permits only one user per channel since it allows the user to use the channel 100% of the time. FDMA is used in the current Analog Mobile Phone System (AMPS).

In a TDMA system the users are still assigned a discrete slice of RF spectrum, but multiple users now share that RF carrier on a time slot basis. A user is assigned a particular time slot in a carrier and can only send or receive information at those times. This is true whether or not the other time slots are being used. Information flow is not continuous for any user, but rather is sent and received in "bursts." The bursts are re-assembled to provide continuous information. Because the process is fast, TDMA is used in IS-54 Digital Cellular Standard and in Global Satellite Mobile Communication (GSM) in Europe. In large systems, the assignments to the time/frequency slots cannot be unique. Slots must be reused to cover large service areas.

CDMA is the basis of the IS-95 digital cellular standard. CDMA does not break up the signal into time or frequency slots. Each user in CDMA is assigned a Pseudo-Noise (PN) code to modulate transmitted data. The PN code is a long random string of ones and zeros. Because the codes are nearly random there is very little correlation between different codes. The distinct codes can be transmitted over the same time and same frequencies, and signals can be decoded at the receiver by correlating the received signal with each PN code.

The great attraction of CDMA technology from the beginning has been the promise of extraordinary capacity increases over narrowband multiple access wireless technology. The problem with CDMA is that the power that the mobiles are required to transmit goes to infinity as the capacity peak is reached (i.e., the mobiles will be asked to transmit more than their capacity allows). The practical consequence of this is that the system load should really be controlled so that the planned service area never experiences coverage failure because of this phenomenon. Thus CDMA is a tradeoff between maximum capacity and maximum coverage.

Over the previous few decades, electronically derived information has taken the form of binary formatted data streams. These data streams are, for the most part, transmitted through telecommunication systems, i.e., wire. Binary industry communication in general commenced with the networking of computer facilities in the mid-1960s. An early networking architecture was referred to as "Arpanet." A short time later, Telenet, the first public packet-switched network, was introduced to commerce. As these networks grew, protocols for their use developed. For example, a coding protocol, ASCII (American Standard Code for Information Interchange) was introduced in 1964. Next, Local Area Networks (LAN) proliferated during the 1970s, the oldest and most prominent, Ethernet, having been developed by Metcalfe in 1973. Under the Ethernet concept, each station of a local system connects by cable to a transceiver and these transceivers are then inter-linked. In 1983, the Institute of Electrical and Electronic Engineers (IEEE) promulgated Ethernet with some modifications, as the first standard protocol for Local Area Networks. The Ethernet protocol remains a standard for essentially all forms of database conveyance or exchange.

It is well known by those skilled in the art that a radio signal consists of at least one electromagnetic energy packet. These packets are comprised of both an electrical field and a magnetic field traveling through space. The mathematical description of each field is that of a sinusoidal shape, with each field conjoined in a transverse relationship, mutually dependant upon one another.

In the traditional usage, when these packets (photons) are generated together into a continuum of sequential sine waves, we have what is referred to as a radio carrier, which, if constituted of identical packets, is said to be un-modulated. For the radio spectrum to be pure, which consists of only one single and narrow radio channel when plotted on a spectral diagram, the packets are conjoined temporally so that as the phase angle of a preceding packet crosses the zero-degree end point, the proceeding packet is just beginning at the zero-degree angle. Thus from the perspective of the observer, a continuous 360 degree undulation of both electrical and magnetic fields would be observed.

Any radio system in use today will modify large groups of these conjoined packets in one or more ways to convey information. For example, a modern wireless phone might transmit near a frequency of 1.9 GHz and modulate the carrier at a rate of about 6 KHz to achieve a data throughput of 14.4 kbps. In this example, a portion of the carrier, consisting of about 316,366 individual sine waves is modified as a group to represent a single binary bit.

To represent the simplest form of communication, the binary system, there are several ways to alter at least one of the following four characteristics of the continuum of sine wave packets (referred to herein as sine waves) to indicate to the receiving mechanism that a binary one or zero is conveyed.

Sine waves can be modified in at least the following four basic ways:

1. Amplitude: The amplitude of the electrical and magnetic fields can be increased or decreased to cause either a larger or smaller signal to be detected at the receiving device. The change in amplitude can represent the conveyance of a binary one or a binary zero or even a change in binary state when the previous state is already known.

2. Frequency: The period of the individual sine waves within a group can be increased or decreased to make the same representation as in example one above. This is also called frequency modulation.

3. Interruption: The continuum of sine waves can be interrupted, then re-established to indicate a zero or one condition, or as in example one and two above, the interruption could represent a change in logic state assuming the previous state was known. This is sometimes known as CW or Pulse code modulation.

4. Phase: The phase of a group of sine waves could be altered so that the sine waves are in fact not sine waves any more. They now consist of an amalgamation of two or more frequencies, whose presence indicates the conditional change in logic state.

Many modulation techniques now exist that use any of the above methods either singularly or in combination. Lately a mixing of these methods has been in popular use because by modifying more than one characteristic, more than one single logic state can be represented. For instance the Quadrature Amplitude Modulation system (QAM) can combine the use of both amplitude and frequency modulation to represent multiple binary combinations.

Even though binary data stream transmission by wire has improved substantially in terms of data transfer rates, that improvement has not been the case where transmission is by utilization of the RF spectrum. Current technology in data stream transmission by wire is shown in U.S. Pat. No. 5,661,373 entitled Binary digital signal transmission system using binary digital signal of electrically discharged pulse and method for transmitting binary digital signal and issued Aug. 26, 1997 to Nishizawa, which discloses a binary digital signal transmission system wherein a transmitter generates a binary digital signal including at least a rise portion where a level of the binary digital signal steeply rises in accordance with inputted binary digital data of a first value, and at least a fall portion where the level of the binary digital signal steeply falls in accordance with the inputted binary digital data of a second value, and then transmits the binary digital signal via a cable to a receiver. On the other hand, the receiver receives the transmitted binary digital signal, and first and second resonance circuits respectively have two resonance frequencies which are even multiples of each other, and extract first and second resonance signals respectively having resonance frequency components of the two resonance frequencies, from the received binary digital signal. Thereafter, a data discriminator discriminates a value of the binary digital data corresponding to the received binary digital signal based on a phase relationship between the extracted first and second resonance signals, and outputs either one of a pulse signal representing the first value and another pulse signal representing the second value.

As discussed above it is well recognized by those skilled in the art that in modern radio communications a troubling problem exists in the utilization of spectrum. Many radio communication services exist to support the market needs of many diverse users. Government agencies regulate the usage of radio spectrum among such diverse users as government, military, private business, radio common carriers (RCC) and unlicensed individual users. The need for radio spectrum is an immense problem. The problem is compounded because modern radio systems transport binary digital information using modulation methods that are merely adaptations of methods that were originally designed for conveyance of analog information. Namely, voice, print, music and video transmissions, which were the sole forms of information in the 20th century, are now quickly being replaced with digital representations of the same. Added to this is the need to allow the user to access digital information from the Internet, corporate databases and other sources. Truly this is a modern problem. Because the means of modulating the radio carrier are still the same as those used in the past, the amount of spectral width required by individual transmitters is ever increasing. Well-known theories of modulation define these modulation systems and dictate that as the amount of information increases in a given modulated stream, the number of spectral byproducts, called sidebands will increase. For instance, using common methods of radio modulation, a typical channel width for a digital transmission will be about ½ of the rate of binary state change. Applied in real terms, a radio transmitter that is conveying information at a rate of 100 kilobits per second (KBPS) will require a clear section of radio spectrum of about 50 KHz of width, with the carrier at the center of the channel. In this age, 100 KBPS is a low rate of data transmission, so in practice many services are requiring huge allocations of the limited spectrum resource.

A solution is required that will allow the maximum amount of information to be conveyed, while sharing the radio spectrum with other users.

Possible solutions that have emerged in recent years included monopulse and Ultra-Wide Band (UWB) communication systems. The problem with these solutions is that all monopulse or UWB communications systems form Power Spectrum Densities that tend to span very wide swaths of the radio spectrum. For instance the FCC has conditionally allowed limited power use of UWB from 3.2 GHz to 10 GHz.

These systems must make use of very wide sections of radio spectrum because the transmit power in any narrow section of the spectrum is very low. Generally any 4 KHz section of the affected spectrum will contain no more than −42 dbm of UWB spectral power. Correlating receivers are used to "gather" such very wide spectral power and concentrate it into detectable pulses. Interfering signals are problematic. Since the communication system is receiving energy over a very wide spectrum, any interfering signal in that spectrum must be tolerated and mitigated within the receiver. Many schemes exist to mitigate the interference. Some of these include selective blocking of certain sections of spectrum so as not to hear the interferer, Orthogonal Frequency Division Multiplexing (OFDM) schemes that send redundant copies of the information in the hope that at least one copy will get through interference, and other more exotic schemes that require sophisticated Digital Signal Processing algorithms to perform advanced filtering. In addition, UWB systems have somewhat of a "bad reputation" because they at least have the potential to cause interference. A heated discourse has gone on for years over the potential that UWB systems can cause interference to legacy spectrum users.

Tri-State Integer Cycle Modulation (TICM) and other Integer Cycle Modulation techniques were designed by the inventor of this application to help alleviate this massive and growing problem. TICM and other integer cycle modulation schemes modulate the carrier during only single RF cycles. The resulting Power Spectrum Density is quite low. Sidebands tend to be very low in power and are virtually undetectible using usual reception means. Therefore, a method of efficiently detecting signals of this type is needed as further disclosed below.

It is therefore an object of this invention to efficiently detect integer cycle events and UWB signals of greatly reduced power.

BRIEF SUMMARY OF THE INVENTION

The invention disclosed in this application uses any integer cycle or impulse type modulation and more particularly is designed to work with a method of modulation named Tri-State Integer Cycle Modulation (TICM) which has been previously disclosed in patent application Ser. No. 10/875,419 filed by the inventor of this disclosure. A description of the TICM technique follows:

The carrier wave consists of a continuum of sine wave RF cycles at a given fixed frequency. This frequency range can vary from low-frequency radio signals to high-frequency microwave.

All RF cycles are sine waves.

Data is imposed upon the carrier wave by altering the base radio frequency of two sine waves of the continuum. A modulation event therefore consists of the frequency modification of two RF sine wave cycles (wavelets). Note that three (3), and only three (3) frequencies are needed for the TICM modulation scheme. These three (3) frequencies can be extremely close (e.g., less than 30 Khz apart, which is a standard cellular channel) or significantly further apart, depending upon the ability of the receiver to differentiate the frequencies. The modulation can thus be thought of as performed on an integer cycle basis. The sequence of events in the formation of one modulation event is as follows:

Insert one sine wave cycle into the carrier cycle continuum that is higher in frequency than the carrier.

Follow the above cycle with another cycle that is lower in frequency than the carrier. Return to the carrier frequency for the next and all successive cycles. The process can also be reversed by inserting first a lower frequency sine wave cycle followed by another cycle that is higher in frequency then returning to the carrier frequency.

Between the base frequency sine waves and the modulated (alternate) frequency sine waves, there is perfect phase continuity. That is to say, the altered frequency sine waves will begin exactly at the 360 degree zero crossing point of the preceding cycle, and will continue through 360 degrees to an end exactly at the zero degree, zero crossing point of the successive sine wave.

The difference in radio frequency between, base carrier cycles and modulation event cycles is arbitrary, only constrained by the ability of the de-modulator to reliably differentiate the two signals.

The receiver (de-modulator) need only compare the frequency (phase time) of the current sine wave to the previous sine wave to determine whether or not a modulation event has occurred.

Modulation systems working on integer cycle basis (like TICM—the method of modulation described above) modulate individual cycles of Radio Frequency (RF). While such systems can transmit data at a very high rate at relatively low (or high) frequency, it is nearly impossible to recover this modulated data using conventional Radio Frequency (RF) detection methods. The ability of radio receivers (using conventional detection methods) to detect integer cycle modulated signal is limited primarily because of group delay/impulse response of the front-end pre-select filter and the demodulator itself. The front-end filter being a tightly tuned, high Q bandpass filter causes the integer cycle modulated signal to ring at a specific frequency therefore losing all the information. While this problem can be overcome by inserting a low Q bandpass filter, at the cost of selectivity, the conventional detector itself being a slow device, relative to the individual RF cycle, cannot keep up with the fast changing pace of the integer cycle modulated signal. To efficiently recover modulated data from integer cycle modulated systems, a special demodulator is preferred that can work on an integer cycle basis in the presence of noise and strong competing signals. The Wavelet Pass Filter (WPF) as disclosed in this patent application is the answer to such a need.

The WPF is a new form of demodulator that detects data in an integer cycle modulated signal in the presence of strong Additive White Gaussian Noise (AWGN) and strong competing signals.

The WPF works by canceling or nulling all the slow moving signals allowing only non-periodic signals (on integer cycle basis) to pass through it. This nulling effect results in a reduction of the interference from other signals thereby improving the signal to noise ratio of the system. When WPFs are stacked in series, each device can be tuned to operate at a slightly different frequency thereby forming a composite device that nulls and demodulates over a wider bandwidth than a single WPF alone could process. The basic idea is to get a flat nulling response within the pass band of the signal. So far multiple WPFs stacked in series has proven to be an ideal approach for obtaining such a flat nulling response.

The basic logic behind the WPF is to delay the incoming integer cycle modulated signal by a fixed amount and then sum or subtract the delayed signal with the non-delayed signal. For example, in case of periodic signals or slow moving signals or stationary signals, when such signals are delayed by integral multiples of their fundamental wavelength then the delayed signal and non-delayed signals (being a periodic signal that repeats after a fixed interval of time) have the same signal characteristics. After addition (or subtraction, whichever is required for a particular system), the resultant signal cancels or nulls itself out.

For example, consider an un-modulated carrier. Add the inverse of a cycle$_{T1}$ to cycle$_{T2}$. The result will be zero. However in the case of an integer cycle modulated carrier, cycle$_{T1}$ may be different in phase, frequency or amplitude than the cycle in time$_{T2}$. Thus the addition will result in a non-zero sum.

When such integer cycle modulated signals are passed through the WPF, the delayed signal is not the inverse of the non-delayed signal when there is data present. So the resultant summed signal does not cancel completely, thus, resulting in a demodulated signal that is present only as long as the data is present in the integer modulated signal. This nulling effect results in reducing the interference from other signals thereby improving the signal to noise ratio of the system. Thus WPF, not only reduces the interference from other channels, but it is a very fast demodulator that has the capability of demodulating the signal on an integer cycle basis.

The invention accordingly, comprises the methods possessing the steps of modulation, transmission, and reception, which are exemplified in the following detailed description.

For a fuller understanding of the nature and objects of the invention, reference should be made to the following detailed description taken in connection with the accompanying drawings.

DESCRIPTION OF THE DRAWINGS

For a fuller understanding of the nature and objects of the invention, reference should be made to the accompanying drawings, in which.

DETAILED DESCRIPTION OF THE INVENTION

The invention disclosed in this application uses any integer cycle, ultra-wide band or impulse type modulation and more particularly is designed to work with a method of modulation named Tri-State Integer Cycle Modulation (TICM) which has been described above.

Modulation systems working on integer cycle basis (like TICM—the method of modulation described above) modulate individual cycles of Radio Frequency (RF) or transmit narrow pulses with or without a carrier. While such systems can transmit data at a very high rate, it is nearly impossible to recover this modulated data using conventional narrow-band Radio Frequency (RF) detection techniques such as heterodyne methods and balanced demodulators. The ability of radio receivers (using conventional detection methods) to detect integer cycle modulated signals is limited primarily because of group delay/impulse response of the front-end pre-select filter and the demodulator itself. The front-end filter being a tightly tuned, high Q bandpass filter causes the integer cycle modulated signal to ring at a specific frequency therefore loosing all the information. While this problem can be overcome by inserting a low Q bandpass filter, at the cost of selectivity, the conventional detector itself being a slow device, relative to the individual RF cycle, cannot keep up with the fast changing pace of the integer cycle modulated signal. Likewise, such very wide-band communications systems typically are designed to share spectrum with many other users. These other users are therefore treated as interference or more correctly, interferers that must be ameliorated by the wideband receiver. To efficiently recover modulated data from integer cycle or other wideband modulated systems, a special demodulator is required that can work on an integer cycle basis in the presence of noise and strong competing signals. The Wavelet Pass Filter (WPF) as disclosed in this patent application is the answer to such a need.

As discussed earlier, A Wavelet Pass Filter delays the incoming signal by a fixed amount. The length of the delay is fixed for a particular system. For example if a component having a fixed delay, for example a coaxial cable, is used as a delaying element, then the length of the coaxial cable for the system is fixed and so will the delay of the system. This delay cannot be changed for the system. However, if programmable delay chips are used, then the lengths of the delay can be changed in accordance with the required specification of the system. Thus WPFs can be broadly classified into the following two main categories: Fixed Length WPFs and Variable/Customized length WPFs.

Fixed Length WPFs can further be subdivided into two categories: Full Wavelength WPFs and Half Wavelength WPFs.

It is further noted that there are many methods that can be used to cause signal propagation delay, coaxial cable being used as in the preferred embodiment described below. Other methods might include, strip line, waveguide, spatial separation and many other methods. No specific method is preferred for the sake of this disclosure.

Below is a detailed explanation of the workings of different types of WPFs.

In the case of the Full Wavelength WPF, the incoming integer cycle modulated signal is delayed by one full wavelength of the carrier's fundamental frequency. The delayed signal is then inverted and added to the non-delayed signal. As mentioned earlier, the WPF can be stacked in series to improve the overall bandwidth of the device and of the integer cycle modulated receiver. Thus λ-WPF can either be a single stage WPF or multiple single stage WPFs, depending on the system requirements.

Figure 1:
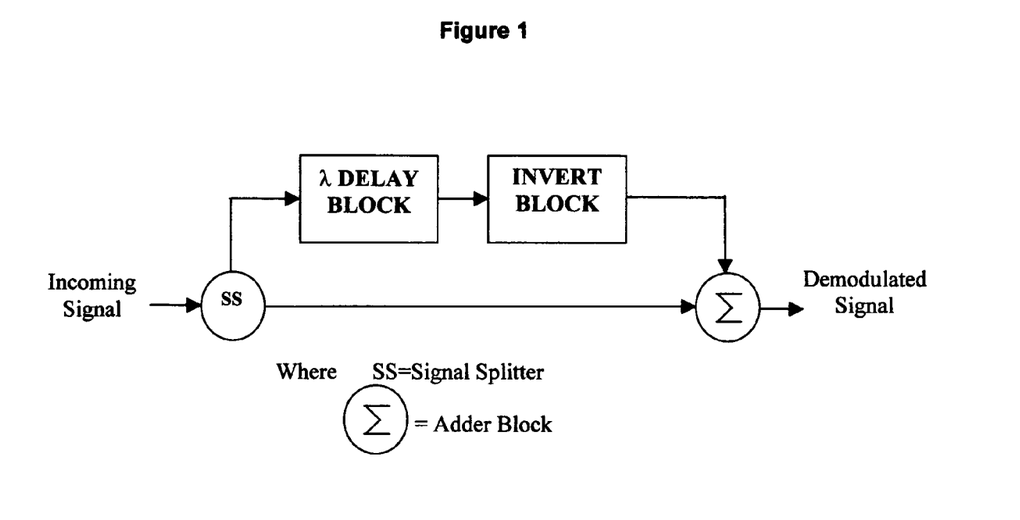
FIG. 1 is a block diagram of a λ-WPF.

As shown in FIG. 1, a single stage λ-WPF consists of four main blocks: The Signal Splitter, The Delay Block, The Invert Block, and The Adder block.

Figure 3:
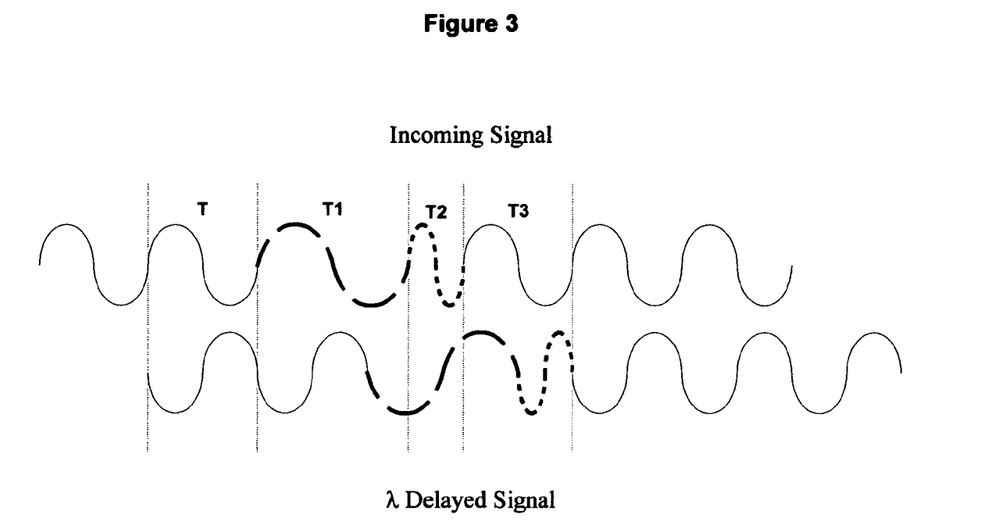
FIG. 3 contains waveform representations at different points in the λ-WPF circuitry.

As shown in FIG. 3, the function of the delay block is to delay the incoming TICM (a type of integer cycle modulated signal) signal by one carrier cycle time. Thus the signal coming out of this block is a delayed replica of the incoming TICM Signal as shown on the second line of FIG. 3. For example, if the center carrier frequency of the incoming TICM Signal is 170.6 MHz, then this delay block is set for 5.86166 nsec. This delay block could be a piece of coaxial cable, a micro-strip, or any programmable delay chip capable of delaying the signal by the required amount. Solid cycles represents cycles of carrier frequency (Fc). The dashed line cycle indicates a cycle of lower frequency (Fl) and a dotted cycle indicates a cycle of upper frequency (Fu). Let us say that at time T, we have Fc (carrier frequency). At time T1, we have Fl (lower frequency). At time T2, we have Fu (upper frequency). And at time T3, we have Fc (carrier frequency). At time T, the delayed inverted signal is equal in amplitude and 180 degrees out of phase with reference to the incoming signal, thus they cancel each other and we get zero output. At time T1, the direct signal is a cycle of frequency Fl, however, the delayed signal is still Fc. The summing device will output a cycle that is equal to the sum of Fc and Fl. Thus the Euclidean distance from Fc to Fl will determine the amplitude of the demodulated integer cycle. At time T2, the situation is different. Here a cycle of Fu is compared with an incomplete cycle of Fl. Because the two frequencies are different so they don't cancel out completely. At time T3, a cycle of Fc is compared with a complete cycle of Fu and the remaining cycle of Fl. Once again, at this time, the compared frequencies are different resulting in a demodulated signal rather than complete cancellation. After time T3, the delayed inverted signal is once again equal in amplitude and 180 degrees out of phase with reference to the incoming signal, thus they cancel each other and we get zero output.

Looking again at FIG. 1, the reader can see that the invert block inverts the incoming delayed signal from the delay block. As a result of inversion, the output signal is 180 degrees out of phase with respect to incoming delayed signal as shown on the second line of FIG. 3. The invert block could be implemented using a simple transformer or other inverter implementations as is well known by those skilled in the art.

Figure 4:
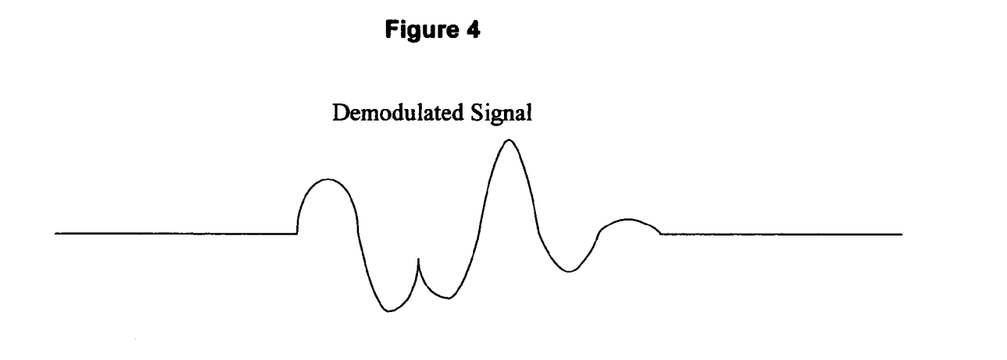
FIG. 4 is a waveform representation for the output of a λ-WPF.

The adder block adds the inverted delayed TICM signal with the non-inverted, non-delayed incoming TICM Signal resulting in an output as shown in FIG. 4. This adder block can be implemented using a number of methods, for example a simple resistive adder, or an operational amplifier, or with a transformer.

The signal splitter simply splits the incoming signal into two paths leading to delay—invert block and to the adder block. (For example, Mini-Circuits part number LRPS-2-1J).

As mentioned earlier, multiple WPFs can be stacked in series to improve the nulling response of the system in terms of bandwidth to be nulled or the depth of nulling. This ultimately results in improving system capacity and at the same time helps improve signal to noise ratio. The choice of multiple WPFs depends upon the application and the specified bandwidth.

Figure 2:
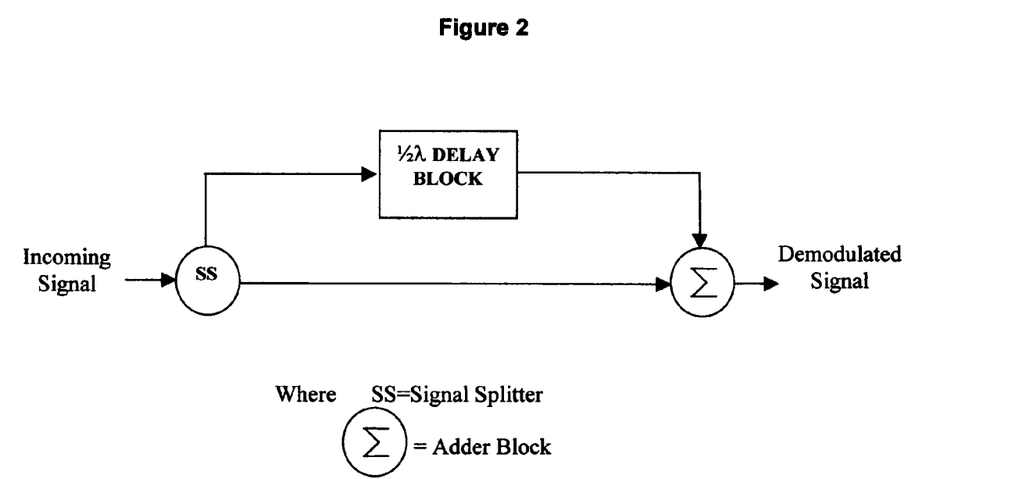
FIG. 2 is a block diagram of a ½λ-WPF.

In the case of half wavelength ($\frac{1}{2}\lambda$) WPFs, the incoming integer cycle modulated signal is delayed by a half wavelength of the carrier's fundamental frequency. The delayed signal is then added to the non-delayed signal. Because this type of WPF does not require signal inversion, it results in less circuit components thereby reducing the overall cost and complexity of the system. As shown in FIG. 2 the $\frac{1}{2}\lambda$ WPF consists of following main blocks: The signal splitter block, delay block, and the adder block.

Figure 5:
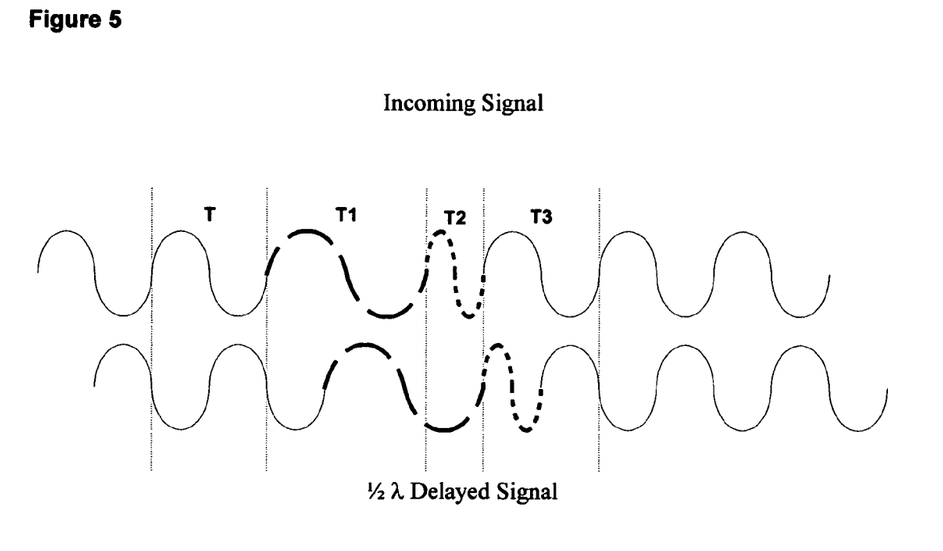
FIG. 5 contains waveform representations at different points in the ½λ-WPF circuitry.

The function of the delay block is to delay the incoming impulse or integer cycle modulated signal by half a carrier cycle time or 1 wavelength. Thus, the signal coming out of this block is a $\frac{1}{2}\lambda$-delayed replica of the incoming TICM Signal as shown on the second line of FIG. 5. Since this block delays the incoming signal by $\frac{1}{2}\lambda$, the output signal is 180 degrees out of phase with respect to incoming signal. For example, if the center carrier frequency of the incoming TICM Signal is 170.6 MHz, then this delay block is set for 2.930832 nsec. This delay block could be a piece of coaxial cable, a micro-strip, or any programmable delay chip capable of delaying the signal by a required amount.

Figure 6:
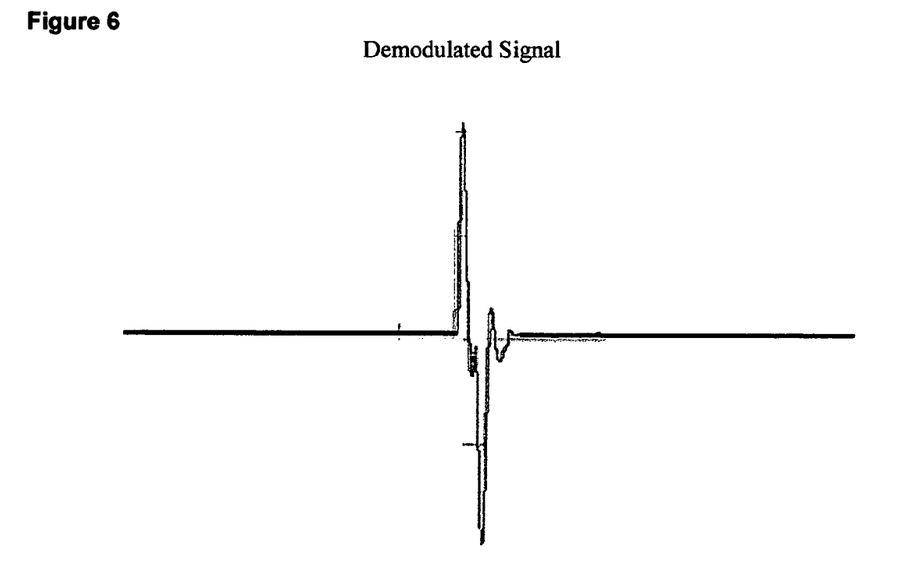
FIG. 6 is a waveform representation for the output of a ½λ-WPF.

The adder block adds the $\frac{1}{2}\lambda$ delayed TICM signal with the non-delayed incoming TICM signal resulting in a signal as shown in FIG. 6. This adder block can be implemented using a number of methods, for example, a simple resistive adder, or an operational amplifier or with a transformer or simply by using signal splitter configured in a signal combiner mode.

The signal splitter simply splits the incoming signal into two paths leading to the $\frac{1}{2}\lambda$ delayed block and to the adder block.

A variable length wavelength WPF is a variable delay circuit and optionally a fixed delay circuit. The variable delay circuit delays each incoming frequency by a specific amount as dictated by the transfer function of the circuit, whereas the fixed delay circuit delays all the frequency components by the same fixed amount. The basic idea of this combination (variable delay and fixed delay) is that for any incoming frequency, the delay in the variable circuit plus, optionally, the delay in the fixed circuit is always equal to one wavelength or $\frac{1}{2}$ wavelength of the incoming frequency. It is possible, depending upon the available variable delay circuits, that the fixed delay portion can be omitted if the variable delay provides adequate over-all delay.

The variable delay circuit can be implemented by using an All-Pass-Filter that has almost linear transfer characteristics whereas coaxial cable is used for implementing a fixed delay circuit.

The delayed signal, after passing through the All Pass Filter and coaxial combination, is then inverted (in the case of the full wavelength version or not inverted in the case of the $\frac{1}{2}$ wavelength version) and added to the non-delayed signal. Because all periodic, slow moving or stationary signals repeat after a fixed interval of time they cancel when they are compared with their own delayed version. Integer cycle or impulse modulated signals change on cycle-by-cycle basis, responsive to the modulated data, thus resulting in a demodulated signal when there is data present and canceling them out when there is no data present.

Figure 7:
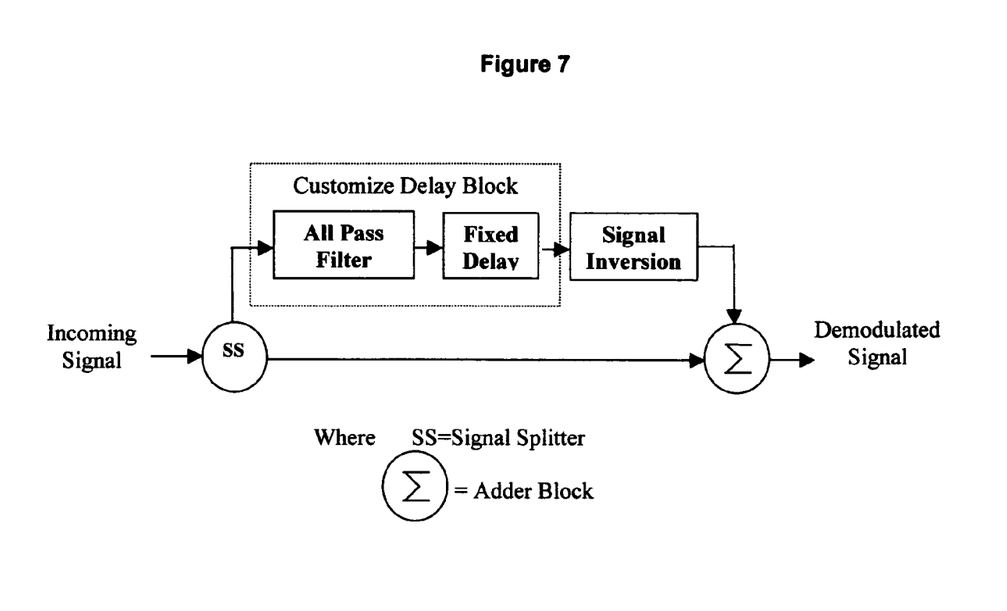
FIG. 7 is a block diagram of a variable length WPF.

The variable delay version of the WPF consists of the following main blocks as shown in FIG. 7.

Signal Splitter Block: The signal splitter splits the incoming signal into two identical signals. One signal is applied to customize delay block while the other signal is applied to the adder block.

Customize Delay Block: The function of this block is to delay the incoming signal by a prescribed amount. The prescribed amount is set by the transfer function characteristics of the All Pass Filter. The All Pass Filter delays incoming signal frequencies by different amounts. The fixed delay block delays all the frequencies by the same amount. This can be implemented in a number of ways, for example by a piece of coaxial cable, or microstrip, or strip line or a trace or any fixed delay component. The object of the variable delay block is that for any incoming frequency, the delay in the All Pass Filter block plus the delay in the fixed delay block is always equal to one wavelength of the incoming frequency. Thus, the signal coming out of this block will be one wavelength delayed as compared to the input signal regardless of the applied frequency. This is equivalent to the delay set up by the full wavelength WPF.

Signal Inversion Block: The purpose of this block is to invert the incoming signal coming out of the customize length block. This function could be implemented using just a transformer or other inverter methods well known to those skilled in the art.

Signal Adder: This adds the inverted delayed signal with non-inverted, non-delayed signal. This adder block can be implemented using a number of methods for example a simple resistive adder, or an operational amplifier or with a transformer or simply by using signal splitter configured in a signal combiner mode.

Likewise the variable delay version of the WPF can be configured as a ½λ WPF as easily as it can be used for a full wavelength version. The advantages of Customize length WPF over fixed length WPF are that the physical length of the coaxial cable is reduced or eliminated. Also, only one stage of WPF is needed to achieve the same bandwidth performance as achieved by several stages ½λ WPF or full wavelength WPF. Further, it reduces the overall cost of the circuit and reduces the complexity of the design. A customize length WPF is much more feasible at lower frequencies, because the length of the cable (needed for ½λ WPF and Full Wavelength WPF) increases at low frequencies. The system is much more flexible with variable delay WPF because the transfer function of the All Pass Filter can be made to suit any requirement. The combination (variable delay circuit and a fixed delay circuit) can be implemented on a chip thus saving space and cost of the circuit. This will also make the system more secure and trouble free.

As mentioned earlier, WPF can be stacked in series to improve nulling response of the system. This ultimately results in improving system capacity and at the same time helps improve signal to noise ratio. The choice of multiple WPF depends upon the application and the specified bandwidth. A block diagram for a three stage WPF is shown in FIG. 8.

Figure 8:
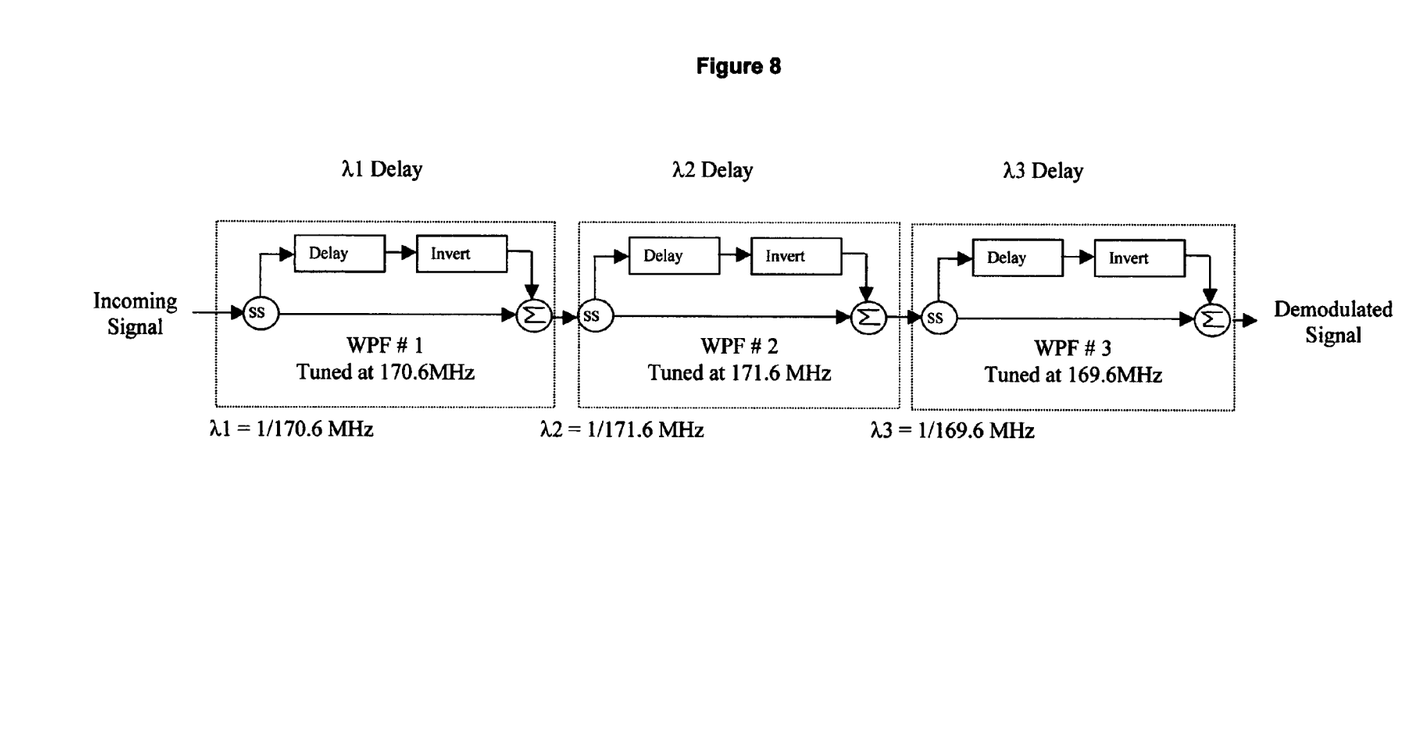
FIG. 8 is a block diagram of a multistage λ-WPF.

From the block diagram of FIG. 8, it is clear that each stage is exactly identical to the first stage with the exception of different delays (i.e., λ1, λ2, λ3). The demodulated signal coming out of the final stage, representing three consecutive data bits, is shown in FIG. 9.

Figure 9:
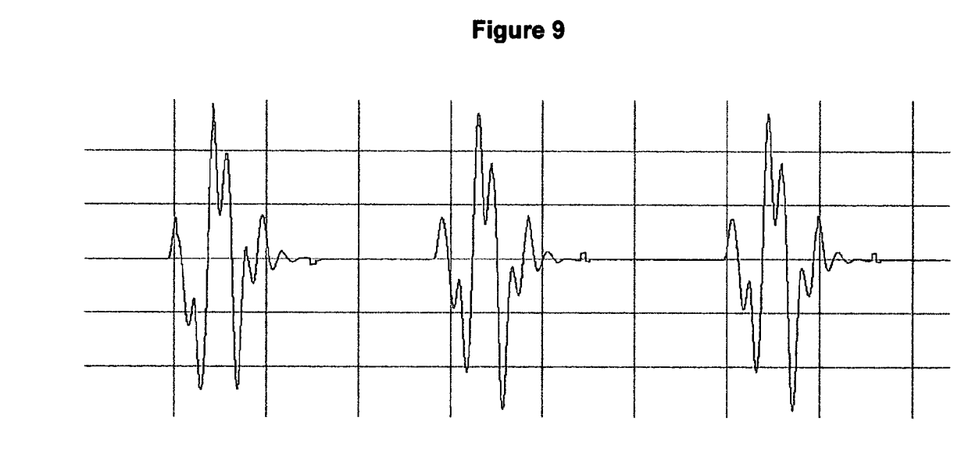
FIG. 9 is a waveform representation for the output of a multistage λ-WPF.

From FIG. 9, it is clear that the three stage WPF produces a demodulated signal that has the same characteristics as a single stage WPF demodulated signal. However the multiple stage WPF can be constructed to work over a much wider bandwidth than the single stage design.

Figure 10:
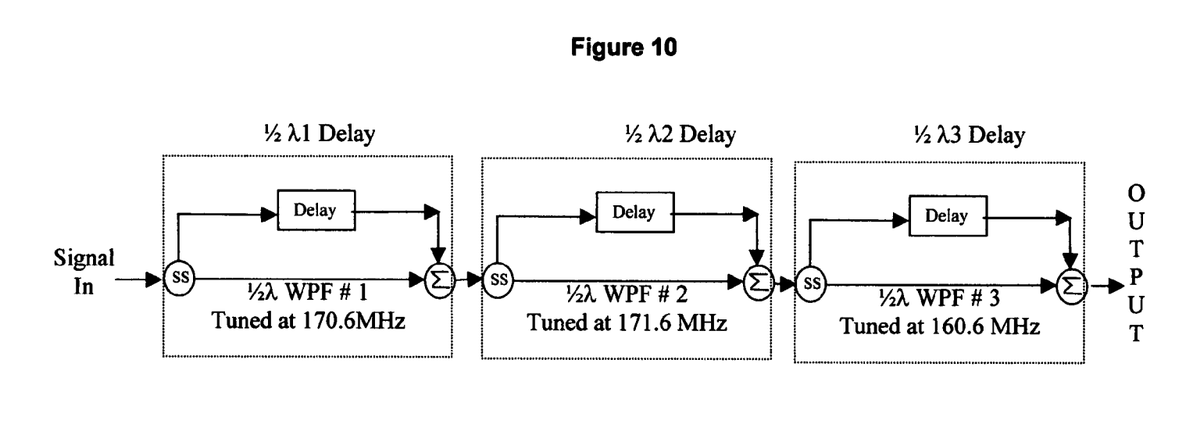
FIG. 10 is a block diagram of a multistage ½λ-WPF.

As mentioned earlier, the ½λ WPF can be stacked in series to improve nulling response of the system. This ultimately results in improving system capacity and at the same time helps improve signal to noise ratio. The choice of multiple ½λ WPFs depends upon the application and the specified bandwidth. A block diagram for a three stage ½ wavelength WPF is shown in FIG. 10.

Figure 11:
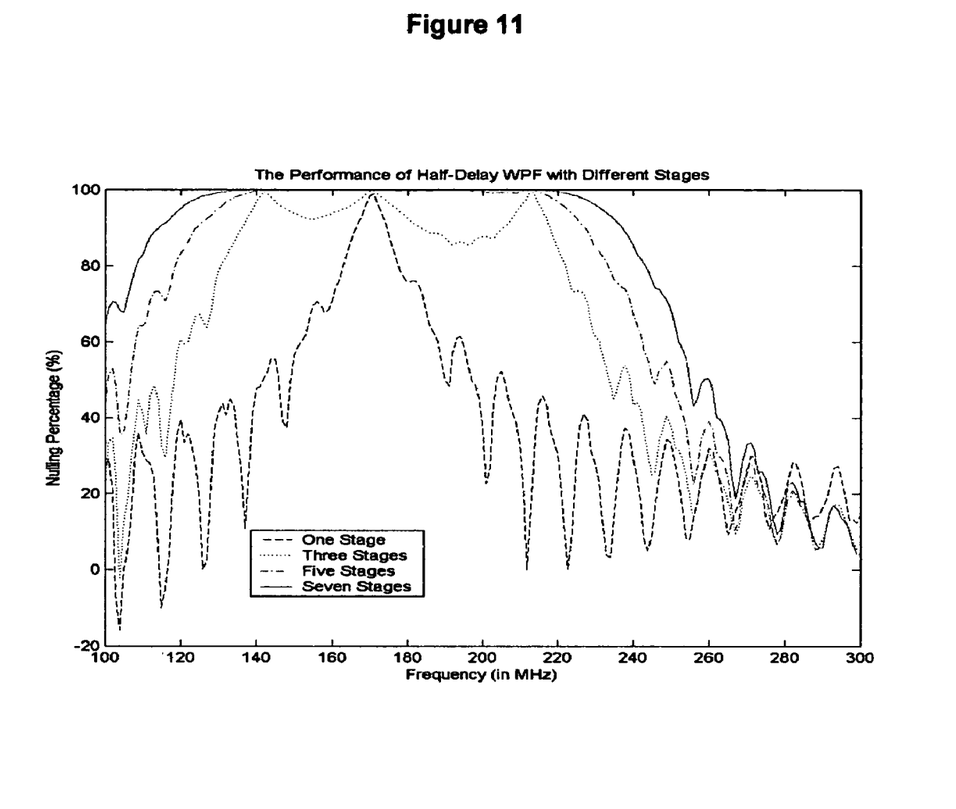
FIG. 11 is a waveform representation for the output of a multistage ½λ-WPF.

From the graph shown in FIG. 11, it is clear that nulling performance improves as numbers of stages are increased in the system.

In this patent application, we introduced three types of WPFs: full-wavelength WPFs, half-wavelength WPFs, customized-wavelength WPFs, and multiple stage customized wavelength WPFs.

The inventors of this disclosure have evaluated the performance of full-wavelength and half-wavelength WPFs with multiple WPF stages via simulations with band-limited noise. Simulations have shown that full-wavelength WPF performs better than half-wavelength WPF when noise is present. If we choose the delay of each WPF stage differently, we can control the increments of noise power so that the demodulated signal can outgrow noise to have better signal detection.

It is also clear from the simulations performed that adding a pre-select bandpass filter ahead of WPF removes much of the noise power, further improving the information recovery.

Because certain changes may be made in the above described integer event detection system and method without departing from the scope of the invention herein involved, it is intended that all matter contained in the description thereof or shown in the accompanying drawings shall be interpreted as illustrative and not in a limiting sense.

What is claimed is:

1. A system for demodulating an inputted radio frequency carrier signal modulated by an integer cycle or impulse event comprising:
    a signal splitter;
    said signal splitter splitting an inputted radio frequency carrier signal modulated by an integer cycle or impulse event into split signal one and split signal two;
    a passive signal delayer;
    said passive signal delayer electrically connected to said signal splitter and said passive signal delayer delaying split signal one by one radio frequency carrier signal wavelength;
    a signal inverter;
    said signal inverter electrically connected to said passive signal delayer and said signal inverter inverting said split signal one after said split signal one is delayed;
    a signal adder; and,
    said signal adder electrically connected to said signal inverter and said signal splitter and said signal adder adding said split signal two and said delayed and inverted split signal one resulting in the nulling of said radio frequency carrier signal and demodulation of an inputted radio frequency carrier signal modulated by an integer cycle or impulse event.

2. The system of claim 1 wherein two or more of the claimed systems are connected serially.

3. The system of claim 1 wherein said passive signal delayer is a combination of fixed passive signal delayer and variable passive signal delayer such that said passive signal delayer delays said split signal one by one radio frequency carrier signal wavelength.

4. The system of claim 3 wherein two or more of the claimed systems are connected serially.

5. The system of claim 4 wherein one of said serially connected systems is tuned to the radio frequency carrier signal each of the remaining serially connected systems are tuned to different wavelengths.

6. A system for demodulating an inputted radio frequency carrier signal modulated by an integer cycle or impulse event comprising:
    a signal splitter;
    said signal splitter splitting an inputted radio frequency carrier signal modulated by an integer cycle or impulse event into split signal one and split signal two;
    a passive signal delayer;
    said passive signal delayer electrically connected to said signal splitter and said passive signal delayer delaying split signal one by one half radio frequency carrier signal wavelength;
    a signal adder; and,
    said signal adder electrically connected to said passive signal delayer and said signal splitter and said signal adder adding said split signal two and said delayed split signal one resulting in the nulling of said radio frequency carrier signal and demodulation of an inputted radio frequency carrier signal modulated by an integer cycle or impulse event.

7. The system of claim 6 further comprising two or more of the claimed systems connected serially.

8. The system of claim 6 wherein said passive signal delayer is a combination of fixed passive signal delayer and variable passive signal delayer such that said passive signal delayer delays said split signal one by one half radio frequency carrier signal wavelength.

9. The system of claim 8 further comprising two or more of the claimed systems connected serially.

10. The system of claim 9 wherein one of said serially connected systems is tuned to the radio frequency carrier signal and each of the remaining serially connected systems are tuned to different wavelengths.

11. A method for demodulating an inputted radio frequency carrier signal modulated by an integer cycle or impulse event comprising:

first splitting, by a signal splitter, an inputted radio frequency carrier signal modulated by an integer cycle or impulse event into split signal one and split signal two;

then delaying, by a passive signal delayer, said split signal one by one radio frequency carrier signal wavelength;

then inverting, by a signal inverter, said delayed split signal one; and, then adding, by a signal adder, said split signal two and said delayed and inverted split signal one resulting in the nulling of said radio frequency carrier signal and demodulation of an inputted radio frequency carrier signal modulated by an integer cycle or impulse event.

12. The method of claim 11 further comprising repeating the claimed method two or more times.

13. The method of claim 11 wherein said signal delaying is a combination of fixed signal delaying by a fixed passive signal delayer and variable signal delaying by a variable passive signal delayer such that split signal one is delayed by one radio frequency carrier signal wavelength.

14. The method of claim 13 further comprising repeating the claimed method two or more times.

15. The method of claim 14 wherein one repetition of the claimed method is at the radio frequency carrier signal and each of the other repetitions of the claimed method are accomplished at different wavelengths.

16. A method for demodulating an inputted radio frequency carrier signal modulated by an integer cycle or impulse event comprising:

first splitting, by a signal splitter, an inputted radio frequency carrier signal modulated by an integer cycle or impulse event into split signal one and split signal two;

then delaying, by a passive signal delayer, split signal one by one half radio frequency carrier signal wavelength; and, then adding, by a signal adder, said split signal two and said delayed split signal one resulting in the nulling of said radio frequency carrier signal and demodulation of an inputted radio frequency carrier signal modulated by an integer cycle or impulse event.

17. The method of claim 16 further comprising repeating the claimed method two or more times.

18. The method of claim 16 wherein said signal delaying is a combination of fixed signal delaying by a fixed passive signal delayer and variable signal delaying by a variable passive signal delayer such that split signal one is delayed by one half radio frequency carrier signal wavelength.

19. The method of claim 18 further comprising repeating the claimed method two or more times.

20. The method of claim 19 wherein one repetition of the claimed method is at the radio frequency carrier signal and each of the other repetitions of the claimed method are accomplished at different wavelengths.

* * * * *